US012772769B2

(12) United States Patent
Wu et al.

(10) Patent No.: US 12,772,769 B2
(45) Date of Patent: Oct. 20, 2026

(54) MANUFACTURING METHOD OF SEMICONDUCTOR STRUCTURE

(71) Applicant: Winbond Electronics Corp., Taichung City (TW)

(72) Inventors: Kun-Che Wu, Taichung City (TW); Tsung-Wei Lin, Taichung City (TW); Chungchen Hsu, Taichung City (TW)

(73) Assignee: Winbound Electronics Corp., Taichung City (TW)

( * ) Notice: Subject to any disclaimer, the term of this patent is extended or adjusted under 35 U.S.C. 154(b) by 343 days.

(21) Appl. No.: 18/592,416

(22) Filed: Feb. 29, 2024

(65) Prior Publication Data

US 2024/0297047 A1 Sep. 5, 2024

(30) Foreign Application Priority Data

Mar. 3, 2023 (TW) ................................ 112107803

(51) Int. Cl.
*H10P 50/00* (2026.01)
*H10P 76/20* (2026.01)
*H10P 76/40* (2026.01)

(52) U.S. Cl.
CPC ............ *H10P 50/695* (2026.01); *H10P 50/69* (2026.01); *H10P 50/692* (2026.01); *H10P 50/71* (2026.01); *H10P 76/2041* (2026.01); *H10P 76/408* (2026.01)

(58) Field of Classification Search
None
See application file for complete search history.

(56) References Cited

U.S. PATENT DOCUMENTS

| | | | | |
|---|---|---|---|---|
| 8,822,321 | B2 | 9/2014 | Kajiwara | |
| 9,218,984 | B2 | 12/2015 | Lee et al. | |
| 2022/0320126 | A1* | 10/2022 | Wang | H10B 41/42 |
| 2023/0282487 | A1* | 9/2023 | Tsai | H10P 50/691 257/506 |

FOREIGN PATENT DOCUMENTS

| | | |
|---|---|---|
| TW | 201913733 | 4/2019 |

* cited by examiner

*Primary Examiner* — Jiong-Ping Lu
(74) *Attorney, Agent, or Firm* — JCIPRNET

(57) ABSTRACT

A manufacturing method of a semiconductor structure includes the following steps. A substrate is provided. A material layer is formed on the substrate. A first hard mask pattern is formed on the material layer. The top-view pattern of the first hard mask pattern is ring-shaped. The first hard mask pattern has an opening. A second hard mask pattern is formed on the first hard mask pattern. The second hard mask pattern fills the opening. The top-view pattern of the second hard mask pattern is completely located inside the outer contour of the top-view pattern of the first hard mask pattern. The pattern of the first hard mask pattern and the pattern of the second hard mask pattern are transferred to the material layer to form a first target pattern.

18 Claims, 6 Drawing Sheets

MANUFACTURING METHOD OF SEMICONDUCTOR STRUCTURE

CROSS-REFERENCE TO RELATED APPLICATION

This application claims the priority benefit of Taiwan application serial no. 112107803, filed on Mar. 3, 2023. The entirety of the above-mentioned patent application is hereby incorporated by reference herein and made a part of this specification.

BACKGROUND

Technical Field

The present disclosure relates to a method for manufacturing a semiconductor structure, and in particular relates to a method for manufacturing a semiconductor structure using lithography-etching-lithography-etching technique.

Description of Related Art

During some processes of manufacturing semiconductor structures, layers of material are patterned to form a target pattern. In order to achieve high pattern density and gradually shrinking line width, some known semiconductor structures are fabricated using double patterning technique, such as Litho-Etch-Litho-Etch (LELE). LELE, also known as pitch splitting, performs two separate lithography and etch steps to define the target pattern, thereby doubling the pattern density. In detail, in the early stage of LELE, the layout patterns that could not be produced through a single step of exposure were disassembled to form two layout patterns with low pattern density, and then made into two masks. Then, two separate exposure steps and two separate etch steps are taken to form two rougher patterns, which are then combined and superimposed to form the initially required high-density layout pattern.

However, due to the limitations of the lithography process, in the target pattern formed by LELE, a concave contour corresponding to the overlapping position of the two rougher patterns is easily formed. When the target pattern is a conductive structure, the concave contour will lead to an increase in contact resistance, and even affect the operation of the semiconductor device. Therefore, how to develop a manufacturing method that may produce a semiconductor structure that meets the expected target pattern is a goal to be achieved with continuous efforts.

SUMMARY

The disclosure provides a method for manufacturing a semiconductor structure, which is able to make the target pattern formed through a patterning process that meets expectations.

The disclosure provides a method for manufacturing a semiconductor structure, which includes the following steps. A substrate is provided. A material layer is formed on the substrate. A first hard mask pattern is formed on the material layer. The top-view pattern of the first hard mask pattern is ring-shaped. The first hard mask pattern has an opening. A second hard mask pattern is formed on the first hard mask pattern. The second hard mask pattern fills the opening. The top-view pattern of the second hard mask pattern is completely inside the outer contour of the top-view pattern of the first hard mask pattern. The pattern of the first hard mask pattern and the pattern of the second hard mask pattern are transferred to the material layer to form a first target pattern.

Based on the above, in the method of manufacturing the semiconductor structure proposed by the present disclosure, the top-view pattern of the first hard mask pattern is ring-shaped, and the first hard mask pattern has an opening. The second hard mask pattern fills the opening, and the top-view pattern of the second hard mask pattern is completely inside the outer contour of the top-view pattern of the first hard mask pattern. The pattern of the first hard mask pattern and the pattern of the second hard mask pattern are transferred to the material layer to form a first target pattern. Therefore, the manufacturing method of the semiconductor structure proposed by the present disclosure may prevent the deformation of the first target pattern formed through the patterning process. That is to say, with the method for manufacturing the semiconductor structure proposed by the present disclosure, the first target pattern formed through the patterning process may meet expectations. In addition, since the first target pattern may meet expectations, the process margin of the subsequent process may be improved.

DESCRIPTION OF THE EMBODIMENTS

Embodiments are listed below and described in detail with accompanying drawings, but the provided embodiments are not intended to limit the scope of the present disclosure. In order to facilitate understanding, the same components will be described with the same labels in the following description. In addition, the drawings are for illustrative purposes only and are not drawn to original scale. In fact, the dimensions of the various features may be arbitrarily increased or reduced for clarity of statements.

Figure 1A:
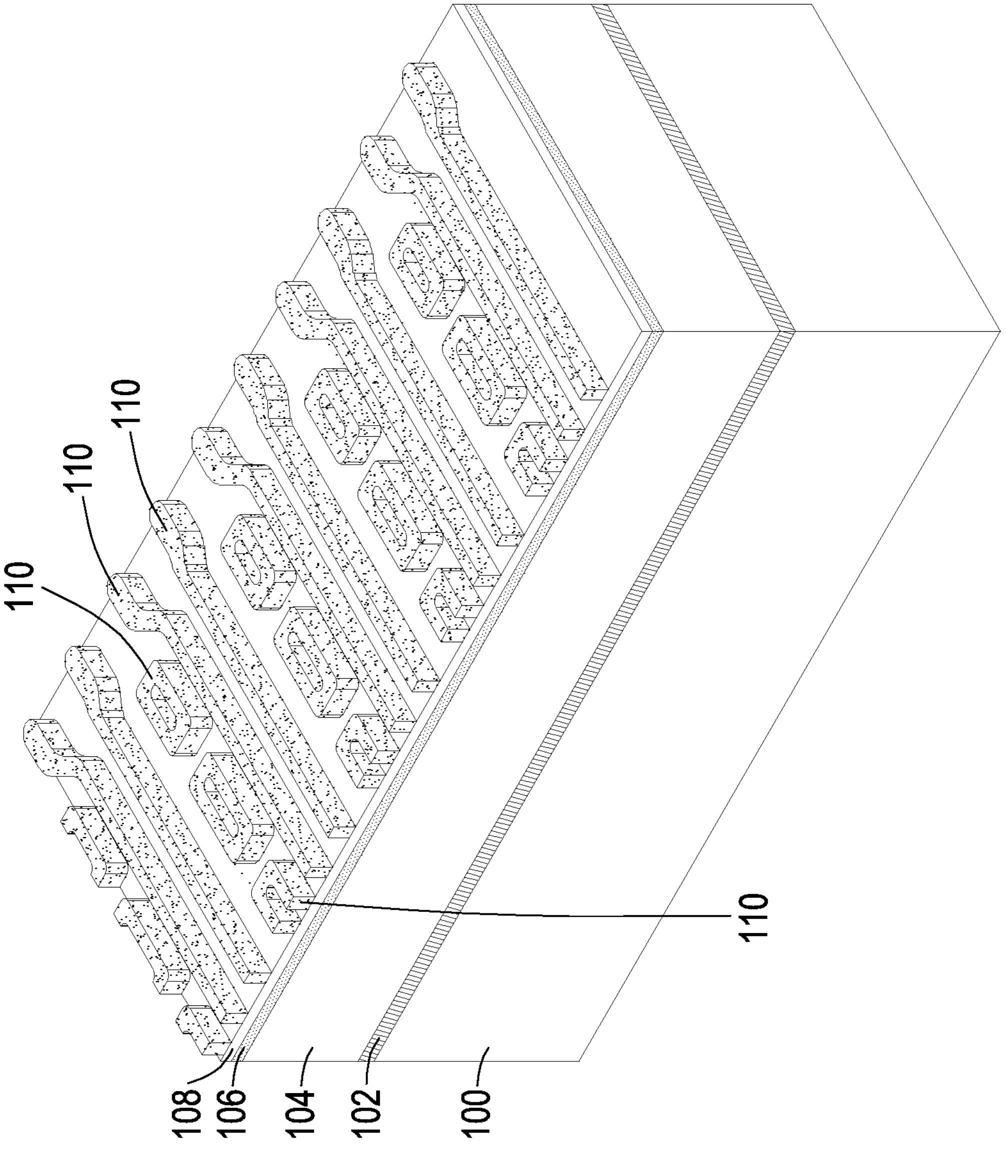
FIG. 1A to FIG. 1F are partial cross-sectional views of a manufacturing method of a semiconductor structure according to some embodiments of the present disclosure.

FIG. 1A to FIG. 1F are partial cross-sectional views of a manufacturing method of a semiconductor structure according to some embodiments of the present disclosure. Referring to FIG. 1A, a substrate 100 is provided. The substrate 100 may be a semiconductor substrate, such as silicon substrate. In addition, although not shown in the figure, required components (such as active devices, dielectric layers, interconnect structures or combinations thereof) may be formed on the substrate 100. Next, a material layer 102 is formed on the substrate 100. In this embodiment, the material layer 102 may be a film layer to pattern. The material layer 102 may be a single-layered structure or a multi-layered structure. In some embodiments, the material of the material layer 102 may be conductive material, dielectric material, or semiconductor material. The material layer 102 is formed by, for example, chemical vapor deposition (CVD) or physical vapor deposition (PVD). In this embodiment, conductive material is taken as an example of the material of the material layer 102, but the disclosure is not limited thereto. In some embodiments, the conductive material is, for instance, tungsten, titanium, titanium nitride or combinations thereof.

Next, a hard mask layer 104 may be formed on the material layer 102. The hard mask layer 104 may be a single-layered structure or a multi-layered structure. In some embodiments, the material of the hard mask layer 104 is, for example, a highly selective and transparent film (HST), silicon nitride, spin on carbon (SOC), silicon oxynitride or a combination thereof. The forming method of the hard mask layer 104 is, for example, CVD, spin coating or a combination thereof. A hard mask layer 106 may then be formed on the material layer 102. In some embodiments, a hard mask layer 106 may be formed on a hard mask layer 104. The material of the hard mask layer 106 is, for example, silicon oxide. The forming method of the hard mask layer 106 is, for example, CVD.

Next, a hard mask layer 108 may be formed on the material layer 102. In some embodiments, hard mask layer 108 may be formed on the hard mask layer 106. The material of the hard mask layer 108 is, for instance, polysilicon. The forming method of the hard mask layer 108 is, for example, CVD.

Furthermore, a patterned photoresist layer 110 may be formed on the hard mask layer 108. The patterned photoresist layer 110 may expose a portion of the hard mask layer 108. In some embodiments, the patterned photoresist layer 110 may be formed by a photolithography process.

Figure 1B:
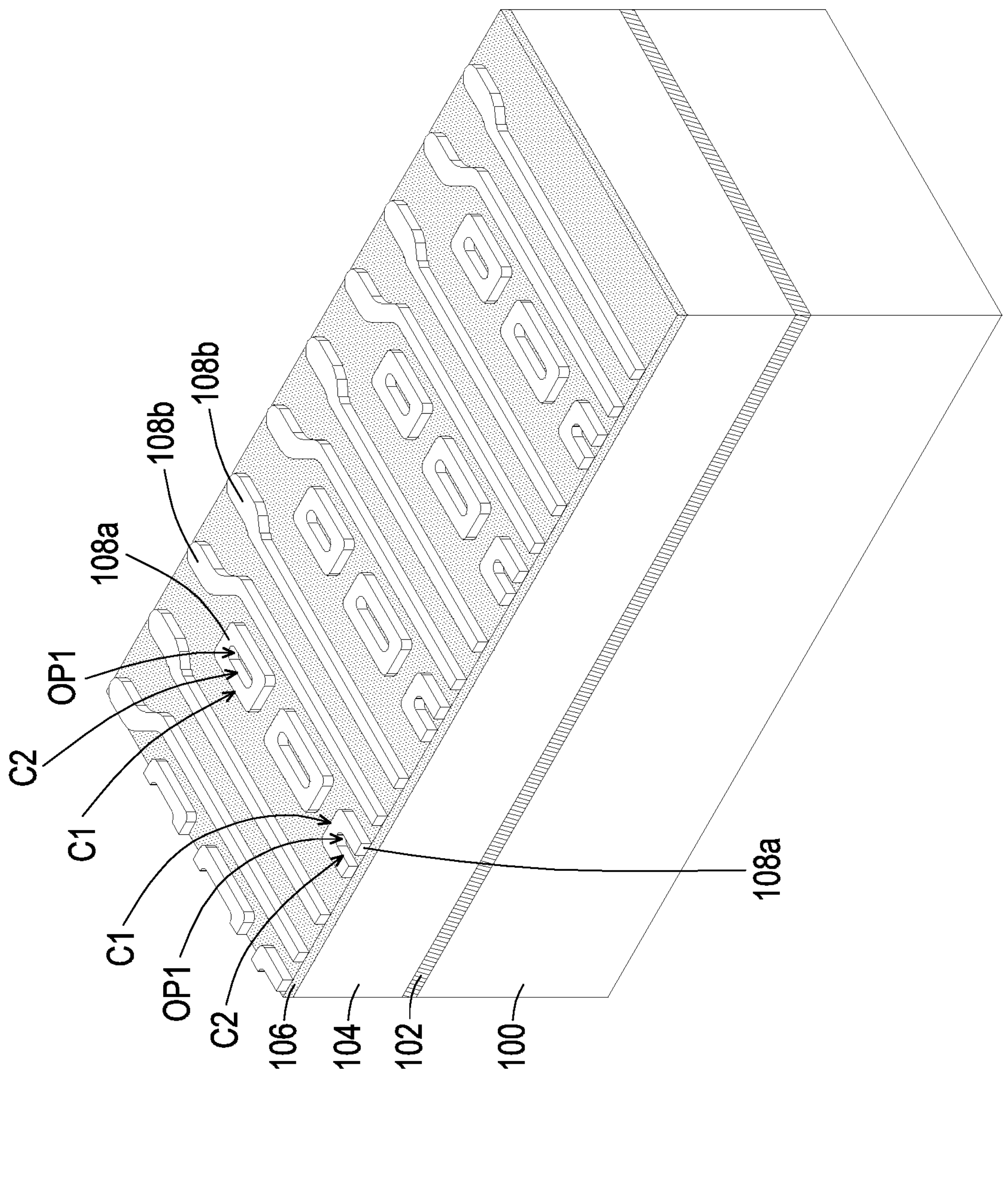

Referring to FIG. 1B, the hard mask layer 108 may be patterned by using the patterned photoresist layer 110 as a mask to form a hard mask pattern 108*a*. Thereby, the hard mask pattern 108*a* may be formed on the material layer 102. In some embodiments, the hard mask pattern 108*a* may be formed on the hard mask layer 106. The top-view pattern of the hard mask pattern 108*a* is ring-shaped. The hard mask pattern 108*a* has an opening OP1. The top-view pattern of the hard mask pattern 108*a* may have an outer contour C1 and an inner contour C2. The outer contour C1 may surround the inner contour C2. In some embodiments, the opening OP1 may penetrate through the hard mask pattern 108*a* to expose a portion of the hard mask layer 106. The material of the hard mask pattern 108*a* is, for example, polysilicon. The hard mask pattern 108*a* may also be referred to as the first exploded pattern of LELE.

In the embodiment, the number of hard mask patterns 108*a* may be multiple, but the disclosure is not limited thereto. It is considered to fall within the scope of the present disclosure as long as the number of the hard mask pattern 108*a* is at least one. In some embodiments, the plurality of hard mask patterns 108*a* may have the same or different shapes and/or sizes. In addition, the shape and/or size of the hard mask pattern 108*a* may be adjusted according to product requirements. It is considered to fall within the scope of the present disclosure as long as the top-view pattern of the hard mask pattern 108*a* is ring-shaped and the hard mask pattern 108*a* has an opening OP1.

In some embodiments, during the process of forming the hard mask pattern 108*a*, the hard mask pattern 108*b* may be formed simultaneously. For example, the patterned photoresist layer 110 may be used as a mask to remove part of the hard mask layer 108 to pattern the hard mask layer 108 to form the hard mask pattern 108*a* and the hard mask pattern 108*b*. In some embodiments, the removal method of part of the hard mask layer 108 is, for example, dry etching. The hard mask pattern 108*a* and the hard mask pattern 108*b* may be separated from each other. In some embodiments, the top-view pattern of the hard mask pattern 108*b* may be in the shape of a strip. The material of the hard mask pattern 108*b* is, for example, polysilicon.

In this embodiment, the number of hard mask patterns 108*b* may be multiple, but the disclosure is not limited thereto. It is considered to fall within the scope of the present disclosure as long as the number of the hard mask pattern 108*b* is at least one. In some embodiments, the plurality of hard mask patterns 108*b* may have the same or different shapes and/or sizes. In addition, those skilled in the art may adjust the shape and/or size of the hard mask pattern 108*b* according to product requirements.

Next, the patterned photoresist layer 110 may be removed. In some embodiments, the removal method of the patterned photoresist layer 110 is, for example, a method of dry stripping or a method of wet stripping.

Figure 1C:
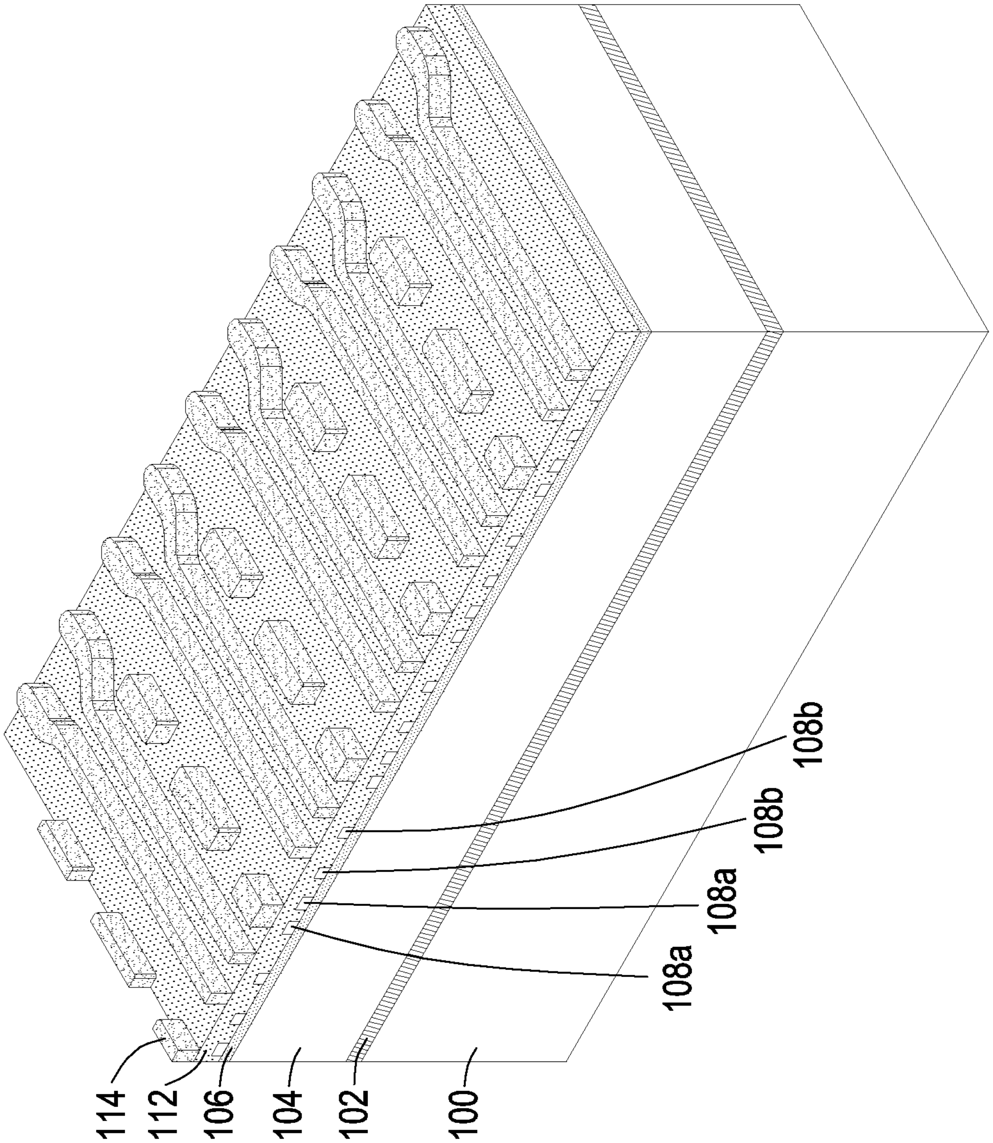

Referring to FIG. 1C, a hard mask layer 112 may be formed on the hard mask pattern 108*a*. In some embodiments, the hard mask layer 112 may be further formed on the hard mask pattern 108*b*. The hard mask layer 112 may fill the opening OP1. The hard mask layer 112 may be a single-layered structure or a multi-layered structure. In some embodiments, the material of the hard mask layer 112 is, for example, spin on carbon (SOC), spin on silicon anti-reflection coating (SOSA), or a combination thereof. A method for forming the hard mask layer 112 is, for example, a method of spin coating. Next, a patterned photoresist layer 114 may be formed on the hard mask layer 112. The patterned photoresist layer 114 may expose a portion of the hard mask layer 112. The patterned photoresist layer 114 may be formed by a photolithography process.

Figure 1D:
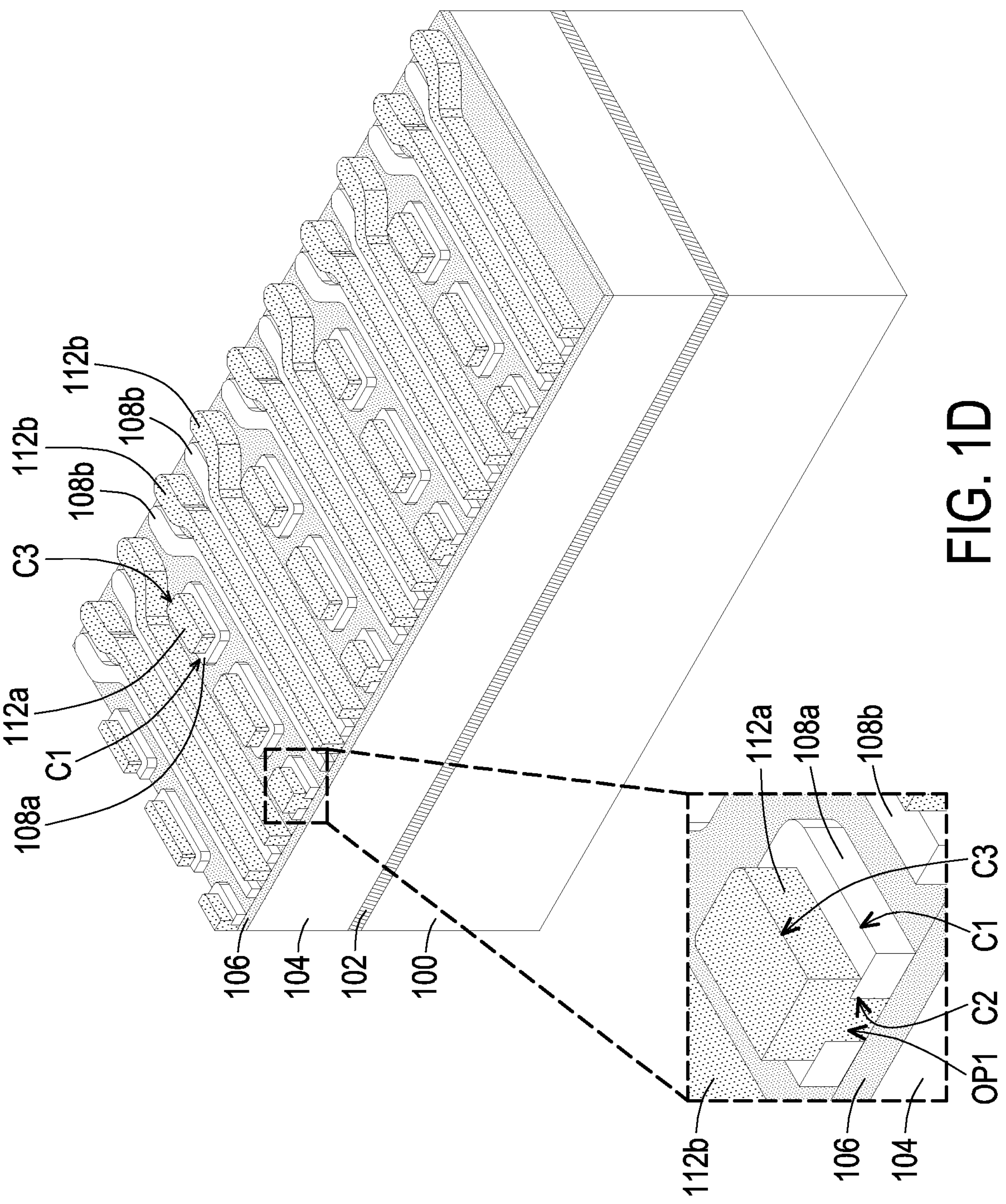

Referring to FIG. 1D, the hard mask layer 112 may be patterned by using the patterned photoresist layer 114 as a mask to form a hard mask pattern 112*a*. Thereby, the hard mask pattern 112*a* may be formed on the hard mask pattern 108*a*. The hard mask pattern 112*a* fills the opening OP1. The top-view pattern of the hard mask pattern 112*a* is completely inside the outer contour C1 of the top-view pattern of the hard mask pattern 108*a*. That is, the outer contour C1 of the top-view pattern of the hard mask pattern 108*a* may surround the contour C3 of the top-view pattern of the hard mask pattern 112*a*. In some embodiments, the contour C3 of the top-view pattern of the hard mask pattern 112*a* may be located between the outer contour C1 and the inner contour C2 of the top-view pattern of the hard mask pattern 108*a*. In some embodiments, the inner contour C2 of the top-view pattern of the hard mask pattern 108*a* may be completely inside the contour C3 of the top-view pattern of the hard mask pattern 112*a*. That is, the contour C3 of the top-view pattern of the hard mask pattern 112*a* may surround the inner contour C2 of the top-view pattern of the hard mask pattern 108*a*. The hard mask pattern 112*a* may also be referred to as a second exploded pattern of LELE.

In some embodiments, during the process of forming the hard mask pattern 112*a*, the hard mask pattern 112*b* may be formed simultaneously. For example, the patterned photoresist layer 114 may be used as a mask to remove part of the hard mask layer 112 to pattern the hard mask layer 112 to form the hard mask pattern 112*a* and the hard mask pattern 112*b*. In some embodiments, the removal method of part of the hard mask layer 112 is, for example, dry etching.

The hard mask pattern 112*a* and the hard mask pattern 112*b* may be separated from each other. In some embodiments, the hard mask pattern 112*b* and the hard mask pattern 108*a* may be separated from each other. In some embodiments, the hard mask pattern 112*b* and the hard mask pattern 108*b* may be separated from each other. In some embodiments, the top-view pattern of the hard mask pattern 112*b* may be in the shape of a strip.

Next, the patterned photoresist layer 114 may be removed. In some embodiments, the removal method of the patterned photoresist layer 114 is, for example, a method of dry stripping or a method of wet stripping.

Figure 1E:
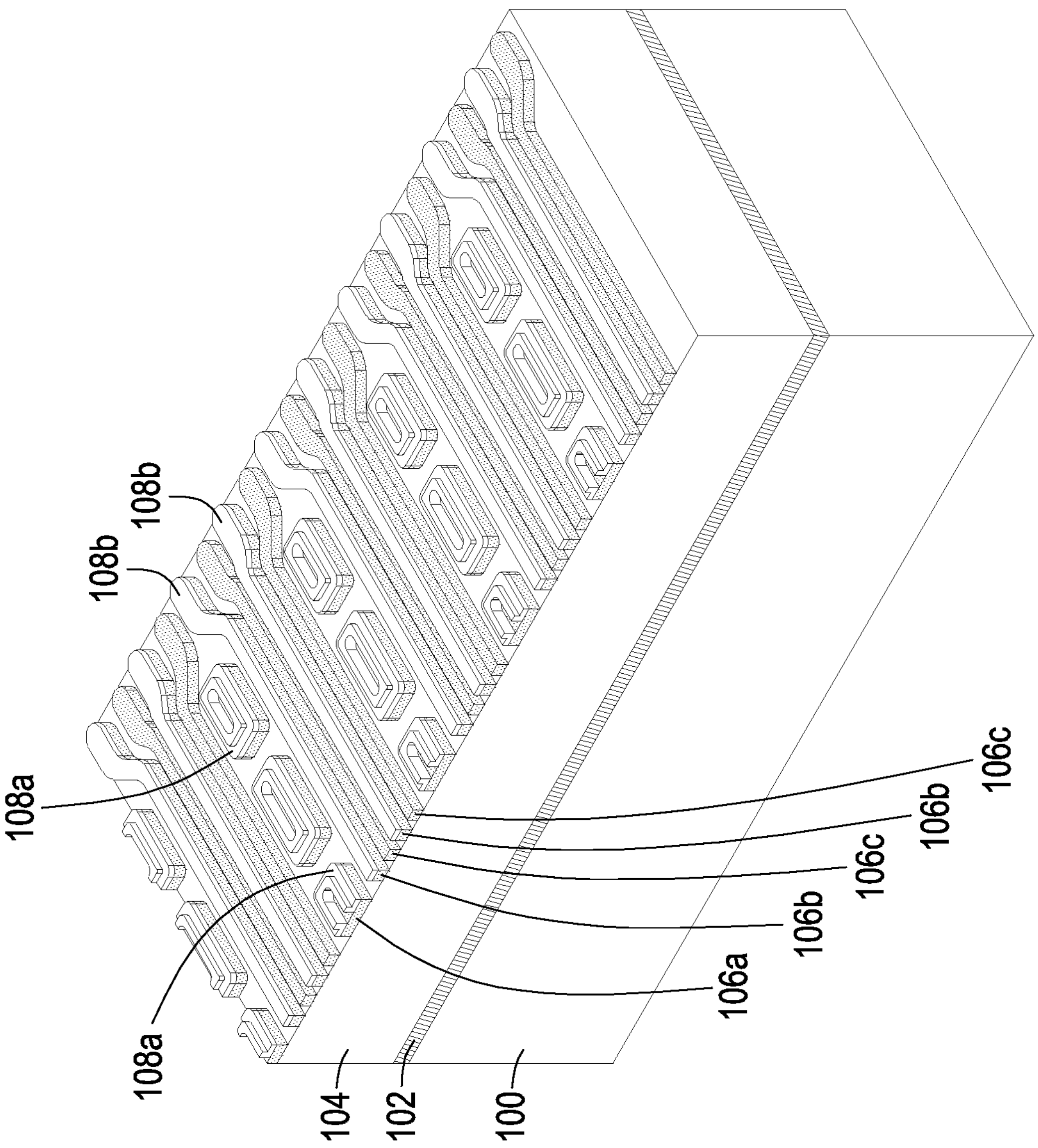

Referring to FIG. 1E, the patterns of the hard mask pattern 108*a* and the hard mask pattern 112*a* may be transferred to the hard mask layer 106 to form the hard mask pattern 106*a*. The top-view pattern of the hard mask pattern 106*a* may correspond to the top-view pattern formed by superimposing the top-view pattern of the hard mask pattern 108*a* and the top-view pattern of the hard mask pattern 112*a*. In some embodiments, the top-view pattern of the hard mask pattern 106*a* may be approximately rectangular, but the disclosure is not limited thereto. In this article, "approximately rectangular shape" refers to a shape in which four right corners of a rectangle are changed to rounded corners. In the embodiment, the number of the hard mask patterns 106*a* may be multiple, but the disclosure is not limited thereto. It is considered to fall within the scope of the present disclosure as long as the number of the hard mask pattern 106*a* is at least one.

In some embodiments, the pattern of the hard mask pattern 108*b* and the pattern of the hard mask pattern 112*b* may be transferred to the hard mask layer 106 to form the hard mask pattern 106*b* corresponding to the hard mask pattern 108*b* and the hard mask pattern 106*c* corresponding to the hard mask pattern 112*b*. In some embodiments, during the process of forming the hard mask pattern 106*a*, the hard mask pattern 106*b* and the hard mask pattern 106*c* may be formed simultaneously. For example, the hard mask layer 106 may be patterned by using the hard mask pattern 108*a*, the hard mask pattern 112*a*, the hard mask pattern 108*b*, and the hard mask pattern 112*b* as masks to remove part of the hard mask layer 106, and form a hard mask pattern 106*a*, a hard mask pattern 106*b*, and a hard mask pattern 106*c*. A method for removing part of the hard mask layer 106 is, for example, dry etching. The hard mask pattern 106*a*, the hard mask pattern 106*b* and the hard mask pattern 106*c* may be separated from one another.

In some embodiments, during the process of transferring the patterns of the hard mask pattern 108*a* and the hard mask pattern 112*a* to the hard mask layer 106, part of the hard mask pattern 108*a* may be removed such that the cross-sectional shape of the hard mask pattern 108*a* may include a stepped shape. In some embodiments, during the process of transferring the pattern of the hard mask pattern 108*b* to the hard mask layer 106, part of the hard mask pattern 108*b* may be removed, which reduces the height of the hard mask pattern 108*b*.

In some embodiments, the hard mask pattern 112*a* may be removed after the hard mask pattern 106*a* is formed. In some embodiments, the hard mask pattern 112*b* may be removed after the hard mask pattern 106*c* is formed. In some embodiments, the hard mask pattern 112*a* and the hard mask pattern 112*b* may be removed simultaneously by the same process. In some embodiments, the removal method of the hard mask pattern 112*a* and the hard mask pattern 112*b* is, for example, a method of drying etching.

Figure 1F:
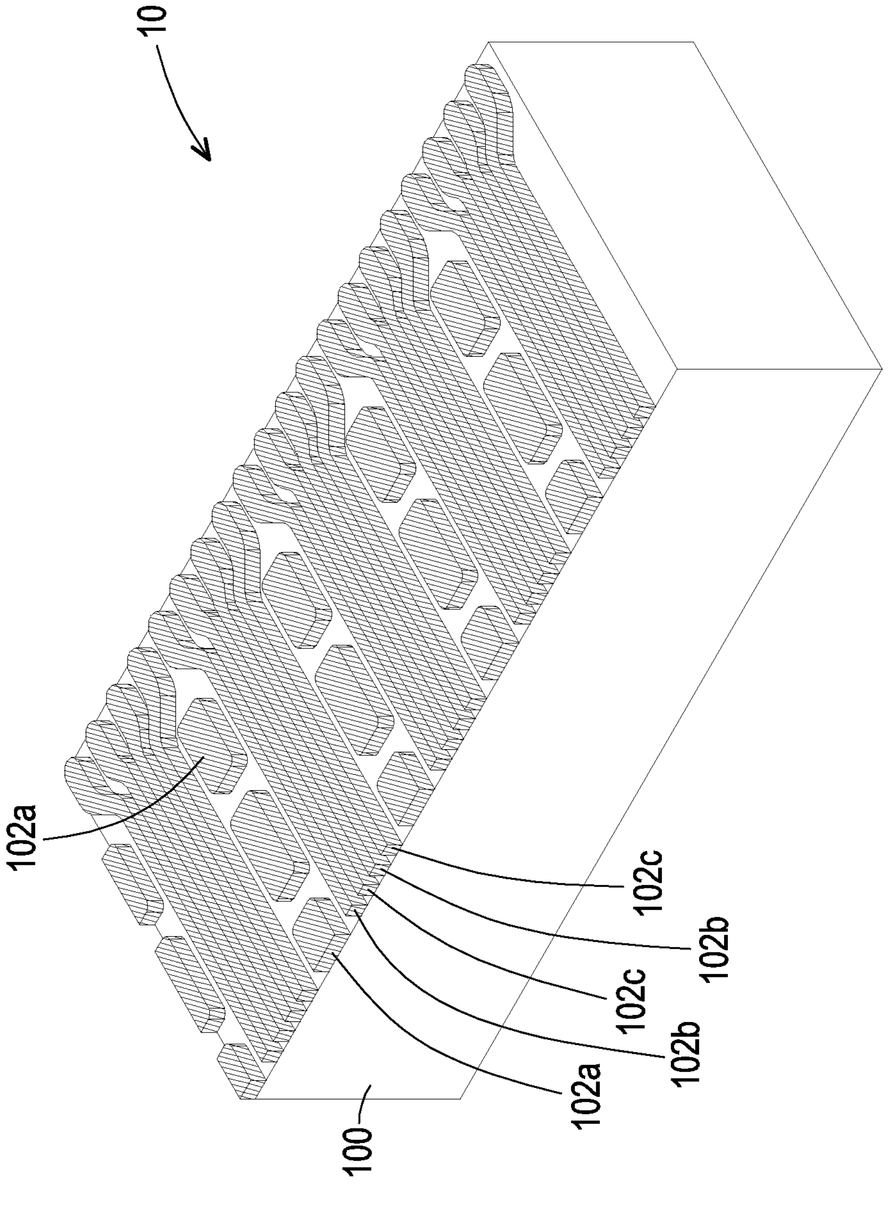

Referring to FIG. 1F, the pattern of the hard mask pattern 106*a* may be transferred to the material layer 102 to form the semiconductor structure 10 with the target pattern 102*a*. The top-view pattern of the target pattern 102*a* may correspond to the top-view pattern of the hard mask pattern 106*a*. With the method of this embodiment, the pattern of the hard mask pattern 108*a* and the pattern of the hard mask pattern 112*a* may be transferred to the material layer 102 through the LELE technique, so as to form the target pattern 102*a*. The top-view pattern of the target pattern 102*a* may correspond to the top-view pattern formed by superimposing the top-view pattern of the hard mask pattern 108*a* and the top-view pattern of the hard mask pattern 112*a*. In some embodiments, the top-view pattern of the target pattern 102*a* may be approximately rectangular, but the disclosure is not limited thereto.

In some embodiments, when the material of the target pattern 102*a* is conductive material, the target pattern 102*a* may be used as a contact pad (e.g., a landing pad), but the disclosure is not limited thereto.

In some embodiments, the pattern of the hard mask pattern 106*b* and the pattern of the hard mask pattern 106*c* may be transferred to the material layer 102 to form a target pattern 102*b* corresponding to the hard mask pattern 106*b* and a target pattern 102*c* corresponding to the hard mask pattern 106*c*. In some embodiments, during the process of forming the target pattern 102*a*, the target pattern 102*b* and the target pattern 102*c* may be formed simultaneously. For example, the hard mask pattern 108*a*, the hard mask pattern 106*a*, the hard mask pattern 108*b*, the hard mask pattern 106*b*, and the hard mask pattern 106*c* may be used as masks to remove part of the hard mask layer 104 and part of the material layer 102, and the hard mask layer 104 and the material layer 102 are patterned, and the target pattern 102*a*, the target pattern 102*b* and the target pattern 102*c* are formed. In some embodiments, the removal method of part of the hard mask layer 104 and part of the material layer 102 is, for example, a method of dry etching. In some embodiments, the hard mask pattern 108*a*, the hard mask pattern 106*a*, the hard mask pattern 108*b*, the hard mask pattern 106*b*, the hard mask pattern 106*c* and the hard mask layer 104 may be removed during the process of forming target pattern 102*a*, target pattern 102*b*, and target pattern 102*c*.

In some embodiments, when the material of the target pattern 102*b* and the target pattern 102*c* are conductive material, the target pattern 102*b* and the target pattern 102*c* may be used as wires, but the disclosure is not limited thereto.

In the embodiment, the pattern of the hard mask pattern 108*a*, the pattern of the hard mask pattern 112*a*, the pattern of the hard mask pattern 108*b* and the pattern of the hard mask pattern 112*b* may be transferred to the hard mask layer 106, the hard mask layer 104 and the material layer 102 by etching process (e.g., a process of dry etching), but the disclosure is not limited thereto. In other embodiments, part of the film layers in the above-mentioned embodiments may be omitted according to requirements. For example, the hard mask layer 104 may be omitted, and the pattern of the hard mask pattern 108*a*, the pattern of the hard mask pattern 112*a*, the pattern of the hard mask pattern 108*b* and the pattern of the hard mask pattern 112*b* may be transferred to the hard mask layer 106 and the material layer 102 by etching process (e.g., a process of dry etching). In other embodiments, the hard mask layer 104 and the hard mask layer 106 may be omitted, and the pattern of the hard mask pattern 108*a*, the pattern of the hard mask pattern 112*a*, the pattern of the hard mask pattern 108*b* and the pattern of the hard mask pattern 112*b* may be transferred to the material layer 102 by etching process (e.g., a process of dry etching).

Based on the above-mentioned embodiments, the top-view pattern of the hard mask pattern 108*a* is ring-shaped, and the hard mask pattern 108*a* has an opening OP1. The hard mask pattern 112*a* fills the opening OP1, and the top-view pattern of the hard mask pattern 112*a* is completely inside the outer contour C1 of the top-view pattern of the hard mask pattern 108*a*. The superposition of the pattern of the hard mask pattern 108*a* and the pattern of the hard mask pattern 112*a* is transferred to the material layer 102 to form the target pattern 102*a*. Therefore, the position of the superposition of the two rougher patterns is not at the edge of the target pattern 102*a*, and the manufacturing method of the present embodiment may prevent the semiconductor structure fabricated by the LELE technique from forming a concave contour. That is to say, by the above-mentioned manufacturing method of the semiconductor structure 10, the target pattern 102*a* of the semiconductor structure manufactured by the LELE technique may meet expectations. In addition, since the target pattern 102*a* may meet expectations, the process margin of the subsequent process may be improved. In addition, when the material of the target pattern 102*a* is conductive material, the contact resistance may be reduced by the above-mentioned manufacturing method of the semiconductor structure 10.

The present disclosure is suitable for making miniaturized semiconductor structures to increase the total number of dies on a wafer. Therefore, the present disclosure may reduce the production cost and energy consumption of manufacturing a single IC, and reduce the production energy consumption of subsequent packaging, thereby reducing carbon emissions in the production process of semiconductor structures. Furthermore, the present disclosure provides a green semiconductor technology with the improved reliability and durability.

Although the present disclosure has been disclosed above with the embodiments, it is not intended to limit the present disclosure. Those skilled in the art may make some changes and modifications without departing from the spirit and scope of the present disclosure. The scope of protection of the present disclosure should be defined by the scope of the appended patent disclosure.

What is claimed is:

1. A method for manufacturing a semiconductor structure, comprising:

providing a substrate;

forming a material layer on the substrate;

forming a first hard mask pattern on the material layer, wherein a top-view pattern of the first hard mask pattern is ring-shaped, and the first hard mask pattern has an opening;

forming a second hard mask pattern on the first hard mask pattern, wherein the second hard mask pattern fills the opening, and a top-view pattern of the second hard mask pattern is completely inside an outer contour of the top-view pattern of the first hard mask pattern, wherein a contour of the top-view pattern of the second hard mask pattern is located between the outer contour of the top-view pattern of the first hard mask pattern and an inner contour of the top-view pattern of the first hard mask pattern; and transferring a pattern of the first hard mask pattern and a pattern of the second hard mask pattern to the material layer to form a first target pattern, wherein the method for forming the first hard mask pattern comprises:

forming a first hard mask layer on the material layer;

forming a first patterned photoresist layer on the first hard mask layer; and patterning the first hard mask layer to form the first hard mask pattern by using the first patterned photoresist layer as a mask.

2. The method of manufacturing the semiconductor structure of claim 1, wherein the contour of the top-view pattern of the second hard mask pattern surrounds the inner contour of the top-view pattern of the first hard mask pattern.

3. The method for manufacturing the semiconductor structure of claim 1, wherein the opening penetrates the first hard mask pattern.

4. The method for manufacturing the semiconductor structure of claim 1, wherein the method for forming the second hard mask pattern comprises:

forming a second hard mask layer on the first hard mask pattern, wherein the second hard mask layer fills the opening;

forming a second patterned photoresist layer on the second hard mask layer; and patterning the second hard mask layer to form the second hard mask pattern by using the second patterned photoresist layer as a mask.

5. The method for manufacturing the semiconductor structure of claim 1, wherein a top-view pattern of the first target pattern corresponds to a top-view pattern formed by superimposing the top-view pattern of the first hard mask pattern and the top-view pattern of the second hard mask pattern.

6. The method for manufacturing the semiconductor structure of claim 1, further comprising:

forming a second hard mask layer on the material layer prior to forming the first hard mask pattern.

7. The method for manufacturing the semiconductor structure of claim 6, wherein the method of transferring the pattern of the first hard mask pattern and the pattern of the second hard mask pattern to the material layer comprises:

transferring the pattern of the first hard mask pattern and the pattern of the second hard mask pattern to the second hard mask layer to form a third hard mask pattern; and transferring the pattern of the third hard mask pattern to the material layer to form the first target pattern.

8. The method for manufacturing the semiconductor structure of claim 7, wherein a top-view pattern of the third hard mask pattern corresponds to a top-view pattern formed by superimposing the top-view pattern of the first hard mask pattern and the top-view pattern of the second hard mask pattern.

9. The method for manufacturing the semiconductor structure of claim 7, wherein in the process of transferring the pattern of the first hard mask pattern and the pattern of the second hard mask pattern to the second hard mask layer, a part of the first hard mask pattern is removed, so that a cross-sectional shape of the first hard mask pattern comprises a step shape.

10. The method for manufacturing the semiconductor structure of claim 7, further comprising:

removing the second hard mask pattern after the third hard mask pattern is formed.

11. The method for manufacturing the semiconductor structure of claim 7, further comprising:

forming a fourth hard mask pattern simultaneously in the process of forming the first hard mask pattern, wherein the first hard mask pattern and the fourth hard mask pattern are separated from each other.

12. The method for manufacturing the semiconductor structure of claim 11, wherein a top-view pattern of the fourth hard mask pattern is in a shape of a strip.

13. The method for manufacturing the semiconductor structure of claim 12, further comprising:

transferring a pattern of the fourth hard mask pattern to the second hard mask layer to form a fifth hard mask pattern corresponding to the fourth hard mask pattern, wherein the third hard mask pattern and the fifth hard mask pattern are separated from each other; and transferring a pattern of the fifth hard mask pattern to the material layer to form a second target pattern corresponding to the fifth hard mask pattern.

14. The method for manufacturing the semiconductor structure of claim 7, further comprising:

forming a fourth hard mask pattern simultaneously in the process of forming the second hard mask pattern, wherein the second hard mask pattern and the fourth hard mask pattern are separated from each other.

15. The method for manufacturing the semiconductor structure of claim 14, wherein a top-view pattern of the fourth hard mask pattern is in a shape of a stripe.

16. The method for manufacturing the semiconductor structure of claim 14, further comprising:

transferring a pattern of the fourth hard mask pattern to the second hard mask layer to form a fifth hard mask pattern corresponding to the fourth hard mask pattern, wherein the third hard mask pattern and the fifth hard mask pattern are separated from each other; and transferring a pattern of the fifth hard mask pattern to the material layer to form a second target pattern corresponding to the fifth hard mask pattern.

17. The method for manufacturing the semiconductor structure of claim 7, further comprising:

forming a fourth hard mask pattern simultaneously in the process of forming the first hard mask pattern, wherein the first hard mask pattern and the fourth hard mask pattern are separated from each other; and forming a fifth hard mask pattern simultaneously in the process of forming the second hard mask pattern, wherein the second hard mask pattern and the fifth hard mask pattern are separated from each other.

18. The method for manufacturing the semiconductor structure of claim 17, further comprising:

transferring a pattern of the fourth hard mask pattern and a pattern of the fifth hard mask pattern to the second hard mask layer to form a sixth hard mask pattern corresponding to the fourth hard mask pattern and a seventh hard mask pattern corresponding to the fifth hard mask pattern, wherein the third hard mask pattern, the sixth hard mask pattern and the seventh hard mask pattern are separated from one another; and transferring a pattern of the sixth hard mask pattern and a pattern of the seventh hard mask pattern to the material layer to form a second target pattern corresponding to the sixth hard mask pattern and a third target pattern corresponding to the seventh hard mask pattern.

* * * * *